(12) United States Patent
Tien et al.

(10) Patent No.: US 6,388,499 B1
(45) Date of Patent: May 14, 2002

(54) LEVEL-SHIFTING SIGNAL BUFFERS THAT SUPPORT HIGHER VOLTAGE POWER SUPPLIES USING LOWER VOLTAGE MOS TECHNOLOGY

(75) Inventors: Ta-Ke Tien; Chau-Chin Wu, both of Cupertino, CA (US)

(73) Assignee: Integrated Device Technology, Inc., Santa Clara, CA (US)

( * ) Notice: Subject to any disclaimer, the term of this patent is extended or adjusted under 35 U.S.C. 154(b) by 0 days.

(21) Appl. No.: 09/770,099

(22) Filed: Jan. 25, 2001

Related U.S. Application Data

(60) Provisional application No. 60/263,009, filed on Jan. 19, 2001.

(51) Int. Cl.$^7$ .......................................... H03K 19/0185
(52) U.S. Cl. ........................................ 327/333; 327/112
(58) Field of Search ................................ 327/333, 112; 326/80, 81, 68

(56) References Cited

U.S. PATENT DOCUMENTS

| | | | |
|---|---|---|---|
| 4,782,250 A | 11/1988 | Adams et al. | 307/473 |
| 5,451,889 A | 9/1995 | Heim et al. | 326/81 |
| 5,467,031 A | 11/1995 | Nguyen et al. | 326/81 |

(List continued on next page.)

OTHER PUBLICATIONS

Dhong et al., "A low–noise TTL–compatible CMOS off–chip driver," IBM J. Res. Develop., vol. 39, No. 1/2, Jan./Mar. 1995.

Bernstein et al., "High Speed CMOS Design Styles," Chapter 6, 1998, pp. 207–246.

*Primary Examiner*—Toan Tran
(74) *Attorney, Agent, or Firm*—Myers Bigel Sibley & Sajovec

(57) ABSTRACT

A level-shifting signal buffer contains a totem pole arrangement of MOS transistors connected to an output thereof and a control circuit that drives the totem pole arrangement of MOS transistors in a preferred manner so that none of the signals across the MOS transistors exceed predetermined limits that may damage the MOS transistors. A preferred signal buffer may include a PMOS pull-up transistor and an NMOS pull-down transistor arranged within a transistor totem pole. This transistor totem pole extends between a first power supply signal line that receives a first power supply signal (e.g., $Vdd_{ext}$) and a reference signal line that receives a reference signal (e.g., GND). The PMOS pull-up transistor may be configured to support a maximum gate-to-drain voltage which is less than a difference in voltage between the first power supply signal and the reference signal. The control circuit, which is responsive to a data input signal, drives gate electrodes of the PMOS pull-up transistor and the NMOS pull-down transistor with signals that cause an output of the transistor totem pole to swing from a voltage of the first power supply signal line to a voltage of the reference signal line during a pull-down time interval, while simultaneously maintaining a gate-to-drain voltage of the PMOS pull-down transistor within the maximum gate-to-drain voltage throughout the pull-down time interval.

36 Claims, 2 Drawing Sheets

U.S. PATENT DOCUMENTS

| | | | |
|---|---|---|---|
| 5,495,183 A | 2/1996 | Suzuki et al. | 326/63 |
| 5,521,531 A | 5/1996 | Okuzumi | 326/81 |
| 5,594,373 A | 1/1997 | McClure | 327/108 |
| 5,596,297 A | 1/1997 | McClure et al. | 327/538 |
| 5,598,122 A | 1/1997 | McClure | 327/538 |
| 5,602,496 A | 2/1997 | Mahmood | 326/71 |
| 5,670,905 A | 9/1997 | Keeth et al. | 327/333 |
| 5,680,064 A | 10/1997 | Masaki et al. | 326/81 |
| 5,694,361 A | 12/1997 | Uchida | 365/189.05 |
| 5,748,026 A | 5/1998 | Maekawa et al. | 327/333 |
| 5,793,592 A | 8/1998 | Adams et al. | 361/90 |
| 5,798,659 A | 8/1998 | Shay et al. | 326/86 |
| 5,834,948 A * | 11/1998 | Yoshizaki et al. | 326/81 |
| 5,892,371 A * | 4/1999 | Maley | 326/81 |
| 5,896,045 A | 4/1999 | Siegel et al. | 326/81 |
| 5,903,179 A | 5/1999 | Kim | 327/309 |
| 6,025,737 A | 2/2000 | Patel et al. | 326/81 |
| 6,031,394 A * | 2/2000 | Cranford, Jr. et al. | 326/80 |
| 6,046,944 A | 4/2000 | Singh | 365/189.09 |
| 6,054,888 A | 4/2000 | Maley | 327/333 |
| 6,057,710 A * | 5/2000 | Singh | 326/80 |
| 6,064,227 A * | 5/2000 | Saito | 326/80 |
| 6,067,257 A | 5/2000 | Kitsukawa et al. | 365/189.11 |
| 6,081,132 A * | 6/2000 | Isbara | 326/81 |
| 6,118,302 A | 9/2000 | Turner et al. | 326/68 |
| 6,147,511 A | 11/2000 | Patel et al. | 326/81 |

* cited by examiner

LEVEL-SHIFTING SIGNAL BUFFERS THAT SUPPORT HIGHER VOLTAGE POWER SUPPLIES USING LOWER VOLTAGE MOS TECHNOLOGY

REFERENCE TO PRIORITY APPLICATION

This application claims priority to U.S. Provisional Application Serial No. 60/263,009, filed Jan. 19, 2001, the disclosure of which is hereby incorporated herein by reference.

FIELD OF THE INVENTION

The present invention relates to integrated circuit devices and methods of operating same, and more particularly to integrated circuit signal buffers and methods of operating integrated circuit signal buffers.

BACKGROUND OF THE INVENTION

Conventional signal buffers frequently include CMOS inverter stages that drive an output signal line rail-to-rail, from a lower reference potential (e.g., GND) to a power supply voltage (e.g., Vdd). Attempts to use such signal buffers at higher power supply voltages frequently require the development and use of MOS transistors that can support correspondingly higher gate-to-drain, gate-to-source and drain-to-source voltages without failure. Accordingly, signal buffers are frequently designed to include MOS transistors that can support the maximum anticipated power supply voltage for a designated application. Unfortunately, the characteristics of MOS transistors capable of supporting higher voltages may not be acceptable for other applications which do not require operation under relatively high voltages, including applications in other portions of an integrated circuit chip that operate at lower internal power supply voltages. To address these issues, level shifting circuits have been developed to "insulate" MOS transistors from higher external power supply voltages by reducing on-chip voltages. However, such circuits may not allow for changes in an external power supply voltage to occur to meet a particular application and/or may not adequately shield all MOS transistors from high voltages.

Thus, notwithstanding the use of such level shifting circuits, there continues to be need to develop signal buffers that have excellent performance characteristics and can be operated at a plurality of different power supply voltages without failure.

SUMMARY OF THE INVENTION

An embodiment of the present invention includes a level-shifting signal buffer that contains a totem pole arrangement of MOS transistors connected to an output thereof and a control circuit that drives the totem pole arrangement of MOS transistors in a preferred manner so that signals across the MOS transistors will not exceed limits that may seriously damage the MOS transistors. A preferred signal buffer may include a PMOS pull-up transistor and an NMOS pull-down transistor arranged within a transistor totem pole. This transistor totem pole extends between a first power supply signal line that receives a first power supply signal (e.g., $Vdd_{ext}$) and a reference signal line that receives a reference signal (e.g., GND). The PMOS pull-up transistor may be configured to support a maximum gate-to-drain voltage which is less than a difference in voltage between the first power supply signal and the reference signal. The control circuit, which is responsive to a data input signal, drives gate electrodes of the PMOS pull-up transistor and the NMOS pull-down transistor with signals that cause an output of the transistor totem pole to swing rail-to-rail from a voltage of the first power supply signal line to a voltage of the reference signal line during a pull-down time interval, while simultaneously maintaining a gate-to-drain voltage of the PMOS pull-down transistor within the maximum gate-to-drain voltage throughout the pull-down time interval.

An additional embodiment includes a level-shifting signal buffer comprising a CMOS inverter configured as a first totem pole arrangement of at least two PMOS transistors connected in series between a first power supply signal line and an output of the CMOS inverter and at least two NMOS transistors connected in series between the output and a reference signal line. A control circuit is also provided that drives the gate electrodes of the at least two PMOS transistors and the at least two NMOS transistors, in response to a data input signal (IN), a first bias signal (PG) having a magnitude that sets a minimum voltage to which a gate electrode of one of the at least two PMOS transistor is driven, a first power supply signal ($Vdd_{ext}$) on the first power supply signal line and a second power supply signal ($Vdd_{int}$) having a magnitude less than a magnitude of the first power supply signal. The magnitude of the first bias signal (PG) may vary as a function of the magnitude of the first power supply signal.

According to this embodiment, the first bias signal (PG) has a magnitude that sets a first minimum voltage to which a gate electrode of an uppermost PMOS transistor in the CMOS inverter is driven and also sets a second minimum voltage to which a gate electrode of a lowermost PMOS transistor in said CMOS inverter is driven. The control circuit may comprise a first PMOS bias transistor and the first minimum voltage may equal a sum of the magnitude of the first bias signal (PG), a magnitude of a threshold voltage ($V_{TP}$) of the first PMOS transistor and a magnitude of a reference signal on the reference signal line. The control circuit may also comprise a second PMOS bias transistor and the second minimum voltage may equal a sum of the magnitude of the first bias signal, a magnitude of a threshold voltage of the second PMOS transistor and a magnitude of a reference signal on the reference signal line. The uppermost PMOS transistor and the lowermost NMOS transistor in the CMOS inverter may also be driven by respective inverters. In particular, a first inverter may be provided that is powered by the first power supply signal and has an output electrically coupled to a gate electrode of the uppermost PMOS transistor. The first inverter may be driven by a level shift circuit that is responsive to the data input signal and first and second bias signals (PG and NG). A second inverter may also be provided that is powered by the second power supply signal and has an output electrically coupled to a gate electrode of a lowermost NMOS transistor.

A preferred level shift circuit comprises a second totem pole arrangement of two PMOS and two NMOS transistors arranged in an alternating sequence with a lowermost NMOS transistor and an uppermost PMOS transistor. The level shift circuit also comprises a pair of cross-coupled PMOS transistors, with a gate electrode of one of the PMOS transistors in the cross-coupled pair being electrically connected to a gate electrode of the uppermost PMOS transistor in the second totem pole. One of the PMOS transistors in the second totem pole is responsive to the first bias signal (PG) and is positioned within a pull-down path therein and one of the NMOS transistors in the second totem pole is responsive to the second bias signal (NG). The level shift circuit may also include a third totem pole arrangement of two PMOS and two NMOS transistors arranged in an alternating sequence and a fourth totem pole arrangement of two PMOS and two NMOS transistors arranged in an alternating sequence, with both the third and fourth totem poles having a lowermost NMOS transistor and an uppermost PMOS transistor. Based on this configuration, the lowermost NMOS transistor in the third totem pole may be responsive to a complementary data input signal ($\overline{IN}$) and the lowermost NMOS transistor in the fourth totem pole may be responsive to the data input signal (IN).

DESCRIPTION OF PREFERRED EMBODIMENTS

Figure 1:
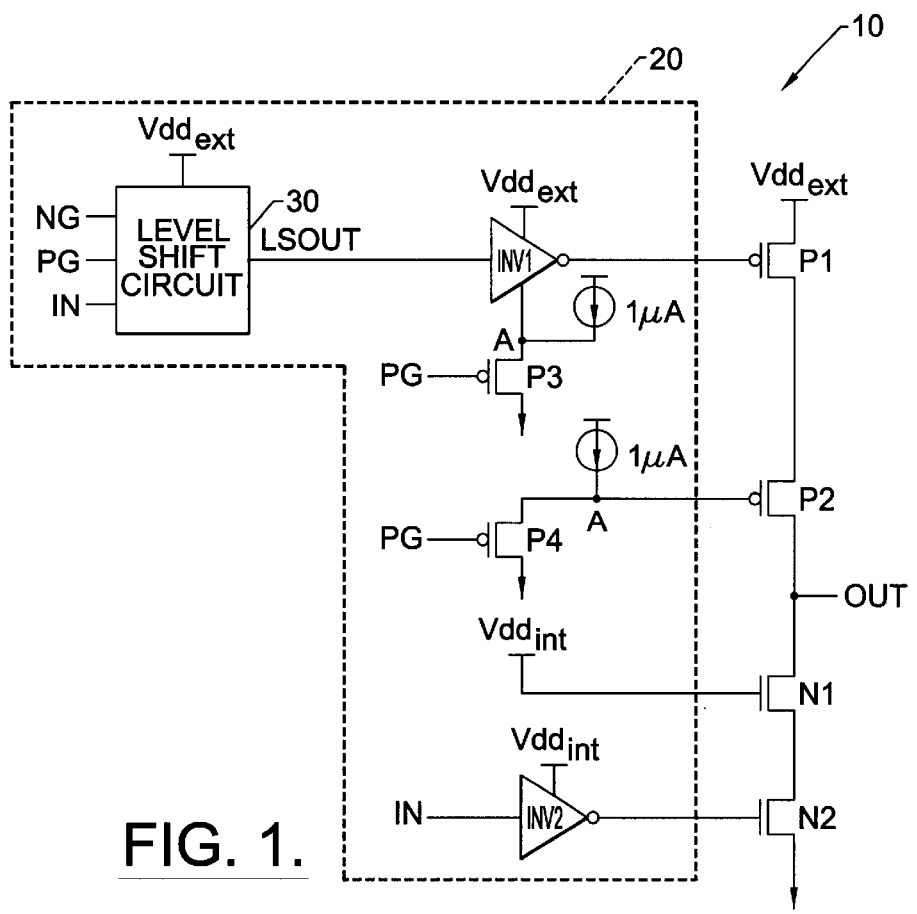
FIG. 1 is an electrical schematic of a signal buffer according to a preferred embodiment of the present invention.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Signal lines and signals thereon may be referred to by the same reference characters. Like numbers refer to like elements throughout.

Figure 3:
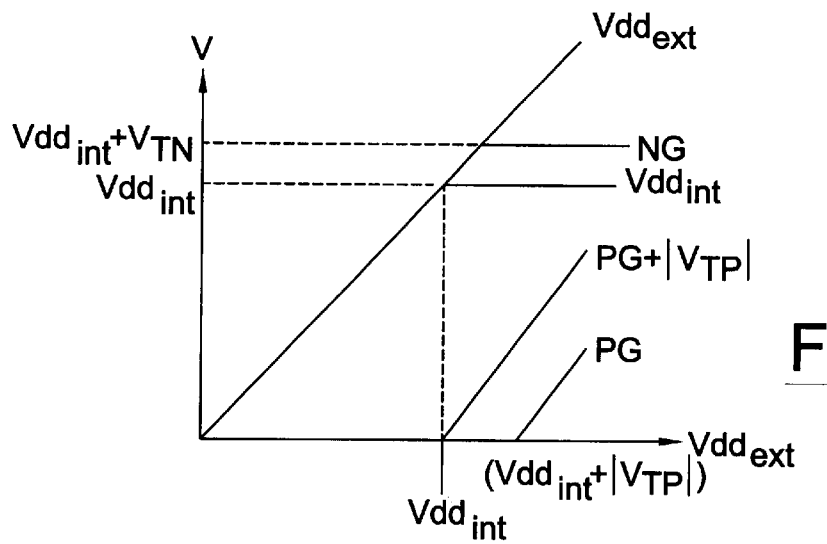
FIG. 3 is a graph that illustrates the voltages of a plurality of signals ($Vdd_{int}$, NG, PG, PG+$|V_{TP}|$), which vary in relation to a magnitude of an "external" power supply signal $Vdd_{ext}$.

Referring now to FIG. 1, a level-shifting signal buffer 10 according to a preferred embodiment of the present invention will be described. As illustrated, the signal buffer 10 is powered at two levels: $Vdd_{int}$ and $Vdd_{ext}$, where $Vdd_{int} \leq Vdd_{ext}$. In particular, the level $Vdd_{ext}$, which may be treated as an "external" power supply voltage that is generated external to an integrated circuit chip, is typically higher than the level $Vdd_{int}$, which may be treated as an "internal" power supply voltage that is generated by an integrated circuit chip containing the signal buffer 10. Alternatively, both $Vdd_{ext}$ and $Vdd_{int}$ may be generated external to the integrated circuit chip or internal to the integrated circuit chip. According to a preferred aspect of the illustrated signal buffer 10, the following relationship can be satisfied: $Vdd_{int} \leq Vdd_{ext} \leq 2Vdd_{int}$. For example, circuits and devices typically designed to operate within a 3 volt part may be used within a 5 volt design. The signal buffer 10 preferably includes a CMOS inverter stage and a control circuit 20 that drives the CMOS inverter stage and is responsive to a data input signal IN. The control circuit 20 may comprise first and second inverters INV1 and INV2 and PMOS biasing transistors P3 and P4 which may be commonly connected at node A to a current source(s) (shown as a 1 microamp current source). The control circuit 20 also preferably comprises a level shift circuit 30 that is responsive to the data input signal and a pair of bias signals PG and NG. As illustrated by FIG. 3, these bias signals PG and NG may have voltage characteristics that vary as the magnitude of $Vdd_{ext}$ varies. For example, the magnitude of bias signal NG may increase with increasing $Vdd_{ext}$ up to a first limit and the magnitude of bias signal PG may increase from a lower level (e.g., 0 volts) after $Vdd_{ext}$ exceeds a threshold level.

As illustrated, the CMOS inverter stage of FIG. 1 is configured as a first totem pole arrangement of two PMOS transistors P1 and P2, connected in series between a first power supply signal line $Vdd_{ext}$ and an output (OUT) (i.e., the "pull-up" path), and two NMOS transistors N1 and N2 connected in series between the output and the reference signal line (i.e., the "pull-down" path). As described herein with respect to the preferred embodiments, the reference signal line is treated as a ground signal line (GND) having a voltage of 0 volts, however, as will be understood by those skilled in the art, the reference signal line may be held at a non-zero reference voltage. The CMOS inverter stage may also comprise more than two PMOS transistors in the pull-up path and more than two NMOS transistors in the pull-down path. These MOS transistors in the pull-up path and pull-down path may be designed and manufactured to operate in a circuit environment which does not typically sustain voltages as high as $Vdd_{ext}$. For example, the MOS transistors may be designed using a process technology and ground rules that result in devices capable of supporting a maximum gate-to-drain, gate-to-source and/or source-to-drain voltage which may be no greater than $Vdd_{int}$, where $Vdd_{int}$ may be substantially lower than $Vdd_{ext}$.

As described more fully hereinbelow, the CMOS inverter stage operates to provide an output signal OUT that swings from a logic 0 level of 0 volts (i.e., GND) to a logic 1 level equal to $Vdd_{ext}$ and vice versa without exposing any of the MOS transistors in the first totem pole arrangement to an excessive voltage. In particular, assuming ideal device characteristics, when the output signal line OUT is pulled to a logic 0 level by operation of the control circuit 20, the gate-to-source and gate-to-drain voltages across NMOS transistors N1 and N2 become equal to $Vdd_{int}$. This state of the output signal line OUT also establishes the drain voltage of PMOS transistor P1 (and the source voltage of PMOS transistor P2) at a level equal to (PG+$|V_{TP}|$+$|V_{TP}|$), where $V_{TP}$ designates the threshold voltage of PMOS transistor P4 and PMOS transistor P2. The gate electrode of PMOS transistor P2 will also be set at a minimum voltage of (PG+$|V_{TP}|$) and the source of PMOS transistor P1 will be set at $Vdd_{ext}$. For simplicity of explanation, the threshold voltages of all the illustrated PMOS transistors are equal to $V_{TP}$ and the threshold voltages of all the illustrated NMOS transistors are equal to $V_{TN}$.

In contrast, when the output signal line OUT is pulled to a logic 1 level equal to $Vdd_{ext}$, the drain-to-gate voltage across NMOS transistor N1 will equal ($Vdd_{ext}$-$Vdd_{int}$) and the drain of NMOS transistor N2 will be pulled up to a maximum voltage of ($Vdd_{int}$-$V_{TN}$), where $V_{TN}$ is the threshold voltage of NMOS transistor N1. Accordingly, neither the establishment of a logic 0 voltage nor a logic 1 voltage of $Vdd_{ext}$ at the output OUT of the signal buffer 10 results in an excessive voltage across any of the transistors in the CMOS inverter stage, even though these transistors may be nominally rated for a part operating at a maximum power supply voltage of $Vdd_{int}$.

Referring still to FIG. 1, the receipt of a logic 1 input signal IN at a voltage $Vdd_{int}$ will operate to turn off NMOS transistor N2 by causing the output of the second inverter INV2 to pull low, and will also operate to turn on PMOS transistor P1. As described more fully hereinbelow with respect to FIG. 2, a logic 1 input signal IN will result in the generation of a logic 1 signal at the output LSOUT of the level shift circuit 30. This logic 1 signal at the output LSOUT will have a voltage equal to $Vdd_{ext}$ and will drive the input of the first inverter INV1 to a logic 1 level. The receipt of a logic 1 input signal by the first inverter INV1 will cause the output of the first inverter INV1 to be pulled down to a logic 0 level. Because the reference terminal of the first inverter INV1 is connected to node A, the logic 0 level at the output of the first inverter will have a minimum voltage equal to $PG+|V_{TP}|$. This logic 0 level will operate to turn on PMOS pull-up transistor P1. Although not shown, the "substrate" or "well" terminal of PMOS transistor P1 (and all other PMOS transistors) may be tied to $Vdd_{ext}$. Based on this configuration of the control circuit 20, the signal buffer 10 of FIG. 1 operates as a non-inverting signal buffer.

Figure 2:
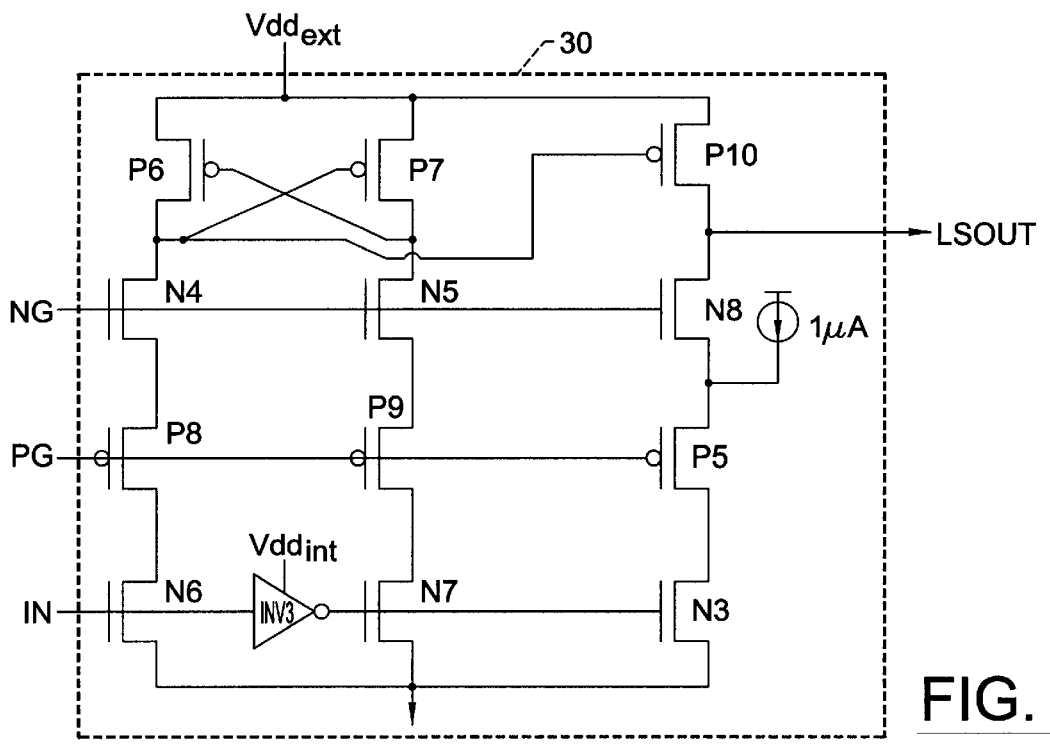
FIG. 2 is an electrical schematic of a preferred level shift circuit that may be used in the signal buffer of FIG. 1.

Referring now to FIGS. 2–3, the operation of a preferred level shift circuit 30 will now be described. As illustrated, the level shift circuit 30 includes a second totem pole arrangement of alternating PMOS and NMOS transistors at an output stage thereof. The second totem pole includes PMOS transistors P10 and P5 and NMOS transistors N8 and N3, with PMOS transistor P10 in the pull-up path and NMOS transistors N8 and N3 and PMOS transistor P5 in the pull-down path. The level shift circuit 30 also includes a third totem pole arrangement of alternating PMOS and NMOS transistors and a fourth totem pole arrangement of alternating PMOS and NMOS transistors. The third totem pole includes PMOS transistors P7 and P9 and NMOS transistors N5 and N7. The fourth totem pole includes PMOS transistors P6 and P8 and NMOS transistors N4 and N6. The level shift circuit 30 also includes a third inverter INV3 which receives the data input signal IN and drives the gate electrodes of NMOS transistors N7 and N3 with a complementary data input signal ($\overline{IN}$).

As illustrated by the preferred circuit of FIG. 2 and the voltage graph of FIG. 3, the first bias signal PG ("P" gate signal), which may be generated by a bias generating circuit (not shown), and the PMOS transistors P8, P9 and P5 operate to protect the upper NMOS and PMOS transistors in the second, third and fourth totem poles (i.e., NMOS transistors N4, N5 and N8 and PMOS transistors P6, P7 and P10) from excessive voltages and also set up the minimum logic 0 voltage to which the output LSOUT can be pulled down to. Likewise, the second bias signal NG ("N" gate signal), which may be generated by the bias generating circuit, and the NMOS transistors N4, N5 and N8 operate to protect the lower NMOS and PMOS transistors in the second, third and fourth totem poles (i.e., PMOS transistors P8, P9 and P5 and NMOS transistors N6, N7 and N3). The level shift circuit 30 performs a level shift function by converting an input signal IN having a voltage swing between 0 and $Vdd_{int}$ into an output signal LSOUT having a voltage swing between $PG+|V_{TP}|$ and $Vdd_{ext}$.

Based on the configuration of the illustrated level shift circuit 30 of FIG. 2, the receipt of a logic 1 data input signal IN will cause NMOS transistor N6 to turn on. The biasing of NMOS transistor N4 and PMOS transistor P8 at levels illustrated by FIG. 3 will also cause PMOS transistor P7 and PMOS pull-up transistor P10 to turn on as their gate electrodes are pulled low by the turn on of NMOS transistor N6. In particular, the gate electrode of PMOS pull-up transistor P10 will be pulled down to a minimum voltage equal to $PG+|V_{TP}|$ (based on the protective clamping provided by the protective PMOS transistor P8). Alternatively, the receipt of a logic 0 data input signal IN will cause NMOS transistors N7 and N3 to turn on. When NMOS transistor N7 turns on, the gate electrode of PMOS transistor P6 is pulled low and the gate electrode of PMOS pull-up transistor P10 is pulled high to $Vdd_{ext}$. This action will enable the output LSOUT to be pulled low to a minimum voltage of $PG+|V_{TP}|$. Here, the minimum voltage at the output LSOUT is set by PMOS transistor P5, which is provided within the pull-down path of the second totem pole. Accordingly, the preferred level shift circuit 30 of FIG. 3 not only performs a level shift function on the data input signal IN, it also includes protection circuitry that enables the use of MOS transistors having lower nominal ratings.

Figure 4:
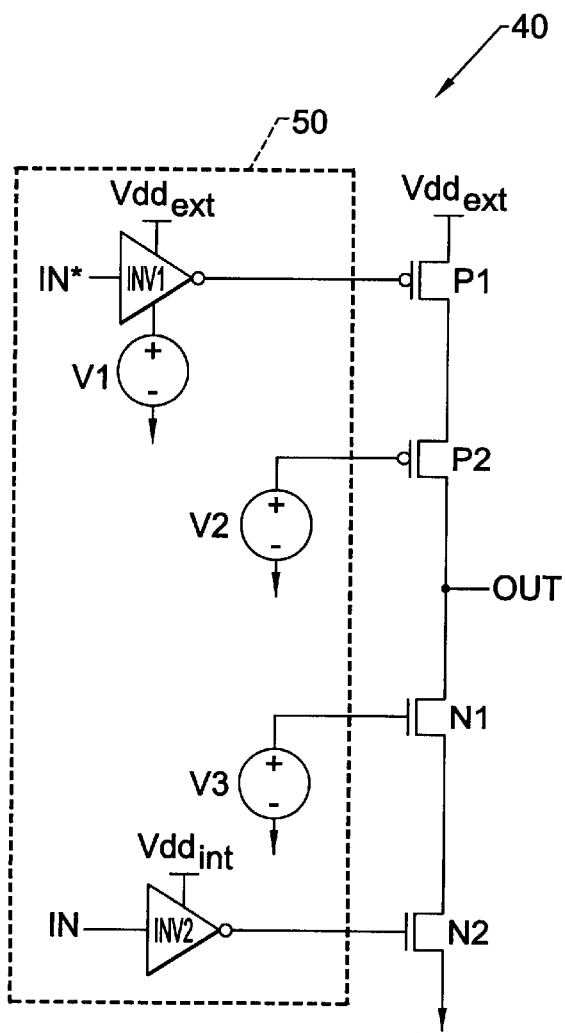
FIG. 4 is an electrical schematic of a signal buffer according to another preferred embodiment of the present invention.

Referring now to FIG. 4, a signal buffer 40 according to another embodiment of the present invention includes a CMOS inverter stage having a pull-up path defined by at least an uppermost PMOS transistor (shown as P1) and a lowermost PMOS transistor (shown as P2) and a pull-down path defined by an uppermost NMOS transistor (shown as N1) and a lowermost NMOS transistor (shown as N2). The signal buffer 40 includes a control circuit 50 that drives the gate electrodes of the transistors in the CMOS inverter. As illustrated, the control circuit 50 may include a plurality of inverters (INV1 and INV2) and additional circuitry that operates as a plurality of voltage sources (shown as V1, V2 and V3) when viewed from the standpoint of a Thevenin equivalent circuit. A first voltage source V1 may be tied to a reference terminal of the first inverter (thereby setting the minimum voltage to which the output of the first inverter may be pulled down to), a second voltage source V2 may be tied to a gate electrode of a lowermost PMOS transistor P2 in the pull-up path, and a third voltage source V3 may be tied to a gate electrode of an uppermost NMOS transistor N1 in the pull-down path. A gate electrode of the uppermost PMOS transistor P1 is driven by a first inverter (INV1) and a gate electrode of the lowermost NMOS transistor N2 is driven by a second inverter (INV2). The second inverter INV2 receives a data input signal (IN) and the first inverter INV1 receives a modified data input signal (IN*). This modified data input signal IN* may constitute an upwards level shifted version of the data input signal IN. For example, in the event the data input signal IN swings between a logic 0 level equal to a ground reference potential (GND) and a logic 1 level equal to a lower power supply voltage (e.g., $Vdd_{int}$), the modified data input signal IN* may swing between a logic 0 level equal to V1 volts and a logic 1 level equal to a higher power supply voltage (e.g., $Vdd_{ext}$). The maximum voltage swing associated with the data input signal IN need not equal the maximum voltage swing associated with the modified data input signal IN*.

Based on the illustrated configuration of the control circuit 50 of FIG. 4, the minimum voltage to which the source of PMOS transistor P2 (and the drain of PMOS transistor P1) will be pulled down to during a pull-down time interval when the output OUT is at the reference voltage (e.g., GND), is $(V2+|V_{TP\text{-}P2}|)$, where $V_{TP\text{-}P2}$ is the threshold voltage of PMOS transistor P2. Moreover, the maximum voltage to which the drain of NMOS transistor N2 (and the source of NMOS transistor N1) will be pulled up to during a pull-up time interval when the output OUT is at the higher power supply voltage of $Vdd_{ext}$, is $V3-V_{TN\text{-}N1}$, where $V_{TN\text{-}N1}$ is the threshold voltage of NMOS transistor N1. According to a preferred aspect of the embodiments of the present invention, the voltage levels of V1, V2 and V3 are preferably held at values which preclude an excessive gate-to-drain (or gate-to-source) voltage from appearing across any of the NMOS or PMOS transistors in the inverter, even where the maximum gate-to-drain (or maximum gate-to-source) voltage that can be supported by the MOS transistors are substantially less than $Vdd_{ext}$ (e.g., $\frac{1}{2}VDD_{ext}$).

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A level-shifting signal buffer, comprising:

a CMOS inverter configured as a first totem pole arrangement of at least two PMOS transistors connected in series between a first power supply signal line and an output of said CMOS inverter and at least two NMOS transistors connected in series between the output and a reference signal line; and a control circuit that drives the gate electrodes of the at least two PMOS transistors and the at least two NMOS transistors, in response to a data input signal, a first bias signal, a first power supply signal provided on the first power supply signal line and a second power supply signal having a magnitude less than a magnitude of the first power supply signal, said control circuit comprising first and second PMOS transistors that are responsive to the first bias signal, with the first PMOS transistor setting a first minimum voltage to which a gate electrode of an uppermost PMOS transistor in said CMOS inverter is pulled-down to and the second PMOS transistor setting a second minimum voltage to which a gate electrode of a lowermost PMOS transistor in said CMOS inverter is pulled-down to;

wherein the first minimum voltage equals a sum of a magnitude of the first bias signal, a magnitude of a threshold voltage of the first PMOS transistor and a magnitude of a reference signal on the reference signal line; and wherein the second minimum voltage equals a sum of the magnitude of the first bias signal, a magnitude of a threshold voltage of the second PMOS transistor and the magnitude of the reference signal.

2. A level-shifting signal buffer, comprising:

a CMOS inverter configured as a first totem pole arrangement of at least two PMOS transistors connected in series between a first power supply signal line and an output of said CMOS inverter and at least two NMOS transistors connected in series between the output and a reference signal line; and a control circuit that drives the gate electrodes of the at least two PMOS transistors and the at least two NMOS transistors, in response to a data input signal, a first bias signal having a magnitude that affects a minimum voltage to which a gate electrode of one of the at least two PMOS transistors is driven, a first power supply signal provided on the first power supply signal line and a second power supply signal having a magnitude less than a magnitude of the first power supply signal, said control circuit comprising:

a first inverter that is powered by the first power supply signal and has an output electrically coupled to a gate electrode of an uppermost PMOS transistor in said CMOS inverter;

a second inverter that is powered by the second power supply signal and has an output electrically coupled to a gate electrode of a lowermost NMOS transistor in said CMOS inverter;

a first PMOS transistor electrically coupled in series between a reference terminal of said first inverter and the reference signal line; and a second PMOS transistor electrically coupled in series between a gate electrode of a lowermost PMOS transistor in said CMOS inverter and the reference signal line.

3. The signal buffer of claim 2, wherein a gate electrode of an uppermost NMOS transistor in said CMOS inverter receives the second power supply signal.

4. The signal buffer of claim 2, wherein said control circuit further comprises a level shift circuit that drives an input of said first inverter and is responsive to the data input signal and the first bias signal.

5. The signal buffer of claim 1, wherein said control circuit further comprises:

a first inverter that is powered by the first power supply signal and has an output electrically coupled to the gate electrode of the uppermost PMOS transistor in said CMOS inverter; and a second inverter that is powered by the second power supply signal and has an output electrically coupled to a gate electrode of a lowermost NMOS transistor in said CMOS inverter.

6. The signal buffer of claim 5, wherein the first PMOS transistor is electrically coupled in series between a reference terminal of said first inverter and the reference signal line; and wherein the second PMOS transistor is electrically coupled in series between the gate electrode of the lowermost PMOS transistor in said CMOS inverter and the reference signal line.

7. The signal buffer of claim 6, wherein said control circuit further comprises a level shift circuit that drives an input of said first inverter and is responsive to the data input signal and the first bias signal.

8. The signal buffer of claim 7, wherein said level shift circuit drives the input of said first inverter with a first inverter input signal having a magnitude that varies in a range between the first minimum voltage and the magnitude of the first power supply signal.

9. The signal buffer of claim 8, wherein a magnitude of the data input signal varies in a range between a magnitude of the reference signal and the magnitude of the second power supply signal.

10. A level-shifting signal buffer, comprising:

a CMOS inverter configured as a first totem pole arrangement of at least two PMOS transistors connected in series between a first poser supply signal-line and an output of said CMOS inverter and at least two NMOS transistors connected in series between the output and reference signal line; and a control circuit that drives the gate electrodes of the at least two PMOS transistors and the at least two NMOS transistors, in response to a data-input signal, a first bias signal having a magnitude that affects a minimum voltage to which a gate electrode of one of the at least two PMOS transistors is driven, a first power supply signal provided on the first poser supply signal line and a second power supply signal having a magnitude less than a magnitude of the first power supply signal, said control circuit comprising:

a first inverter that is powered by the first power supply signal and has an output electrically coupled to a gate electrode of a uppermost NMOS transistor in said CMOS inverter; and a second inverter that is powered by the second power supply signal and has an output electrically coupled to a gate electrode of a loweremost NMOS transisitor in said CMOS inverter; and a level shift circuit that drives an input of said first inverter and is responsive to the data input signal and the first bias signal, said level shift circuit comprising a second totem pole arrangement of two PMOS and two NMOS transistors arranged in an alternating sequence with a lowermost NMOS transistor and an uppermost PMOS transisitor.

11. The signal buffer of claim 10, wherein said level shift c comprises a pair of cross-coupled PMOS transistors; and wherein a gate electrode of one of the PMOS transistors in the cross-coupled pair is electrically connected to a gate electrode of the uppermost PMOS transistor in the second totem pole.

12. The signal buffer of claim 10, wherein said level shift circuit is responsive to a second bias signal; wherein one of the PMOS transistors in the second totem pole is responsive to the first bias signal and is positioned within a pull-down path therein; and wherein one of the NMOS transistors in the second totem pole is responsive to the second bias signal.

13. The signal buffer of claim 11, wherein said level shift circuit is responsive to a second bias signal; wherein one of the PMOS transistors in the second totem pole is responsive to the first bias signal; wherein one of the NMOS transistors in the second totem pole is responsive to the second bias signal; and wherein the lowermost NMOS transistor in the second totem pole is responsive to a complementary data input signal.

14. The signal buffer of claim 13, wherein said level shift circuit further comprises:
a third totem pole arrangement of two PMOS and two NMOS transistors arranged in an alternating sequence with a lowermost NMOS transistor and an uppermost PMOS transistor; and
a fourth totem pole arrangement of two PMOS and two NMOS transistors arranged in an alternating sequence with a lowermost NMOS transistor and an uppermost PMOS transistor.

15. The signal buffer of claim 14, wherein the lowermost NMOS transistor in the third totem pole is responsive to the complementary data input signal; and wherein the lowermost NMOS transistor in the fourth totem pole is responsive to the data input signal.

16. The signal buffer of claim 15, wherein one of the PMOS transistors in the cross-coupled pair is in the third totem pole and another of the PMOS transistors in the cross-coupled pair is in the fourth totem pole.

17. A level-shifting signal buffer, comprising:
a totem pole arrangement of at least two PMOS transistors connected in series between a first power supply signal line and an output of the buffer and at least two NMOS transistors connected in series between the output and a reference signal line; and
a control circuit that in response to a data input signal drives gate electrodes of the at least two PMOS transistors and the at least two NMOS transistors with signals that enable the output to swing from a voltage of the reference signal line to a voltage of the first power supply signal line during a pull-up interval and vice versa during a pull-down interval, said control circuit comprising a level shift circuit that generates a level-shifted data input signal in response to the data input signal and a first bias voltage having a magnitude that sets a minimum level of the level-shifted data input signal, said level shift circuit comprising a second totem pole arrangement of two PMOS transistors and two NMOS transistors connected in alternating sequence between the first power supply signal line and reference signal line.

18. The buffer of claim 17, wherein said control circuit comprises:

a first inverter having an input that receives the level-shifted data input signal and an output electrically coupled to a gate electrode of an uppermost PMOS transistor in said totem pole arrangement.

19. The buffer of claim 18, wherein said control circuit comprises:
a second inverter having an input that receives the data input signal and an output electrically coupled to a gate electrode of a lowermost NMOS transistor in said totem pole arrangement.

20. The buffer of claim 19, wherein said first inverter comprises a PMOS transistor having a source electrically coupled to the first power supply signal line and a drain electrically coupled to the gate electrode of the uppermost PMOS transistor in said totem pole arrangement.

21. The buffer of claim 20, wherein said second inverter comprises a PMOS transistor having a source electrically coupled to a second power supply signal line and a drain electrically coupled to the gate electrode of the lowermost NMOS transistor in said totem pole arrangement; and wherein a power supply voltage on the second power supply signal line is less than a power supply voltage on the first power supply signal line.

22. The buffer of claim 18, wherein a drain of a first of the two PMOS transistors in the second totem pole arrangement is electrically connected to an input of said first inverter.

23. The buffer of claim 22, wherein a gate of a second of the two PMOS transistors in the second totem pole arrangement is responsive to the first bias voltage.

24. The buffer of claim 23, wherein a gate of one of the two NMOS transistors in the second totem pole arrangement is responsive to a second bias voltage.

25. The buffer of claim 21, wherein a drain of a first of the two PMOS transistors in the second totem pole arrangement is electrically connected to an input of said first inverter.

26. The buffer of claim 25, wherein a gate of a second of the two PMOS transistors in the second totem pole arrangement is responsive to the first bias voltage.

27. The buffer of claim 26, wherein a gate of one of the two NMOS transistors in the second totem pole arrangement is responsive to a second bias voltage.

28. The buffer of claim 26, wherein said second totem pole arrangement is configured so that the minimum level of the level-shifted data input signal is about equal to a sum of the first bias voltage and a magnitude of a threshold voltage of the second of the two PMOS transistors in the second totem pole arrangement.

29. The buffer of claim 26, wherein the first bias voltage is positive; and wherein said second totem pole arrangement is configured so that the minimum level of the level-shifted data input signal is about equal to a sum of the first bias voltage and a magnitude of a threshold voltage of the second of the two PMOS transistors in the second totem pole arrangement.

30. A level-shifting signal buffer, comprising:
a first totem pole arrangement of at least two PMOS transistors connected in series between a first power supply signal line and an output of the buffer and at least two NMOS transistors connected in series between the output and a reference signal line; and
a control circuit that drives said first totem pole arrangement in response to a data input signal, said control circuit comprising a level shift circuit that generates a level-shifted output signal in response to the data input signal, said level shift circuit comprising a second totem pole arrangement of two PMOS transistors and two NMOS transistors that are connected in alternating sequence between the first power supply signal line and the reference signal line.

31. The buffer of claim 30, wherein said control circuit further comprises an inverter that drives a gate of an uppermost PMOS transistor in said first totem pole arrangement in response to the level-shifted output signal.

32. The buffer of claim 30, wherein said control circuit is connected to a second power supply signal line; wherein a magnitude of a first power supply signal provided on the first power supply signal line is greater than or equal to a magnitude of a second power supply signal provided on the second power supply signal line; wherein a gate of a lowermost PMOS transistor in the second totem pole arrangement is responsive to a first bias signal; and wherein for a first power supply signal having a magnitude that exceeds a first threshold level, the first bias signal has a magnitude that varies directly with changes in the magnitude of the first power supply signal.

33. The buffer of claims 32, wherein the first threshold level is about equal to a sum of a magnitude of the second power supply signal and an absolute value of a threshold voltage of the lowermost PMOS transistor in the second totem pole arrangement.

34. The buffer of claim 33, wherein a gate of an uppermost NMOS transistor in the second totem pole arrangement is responsive to a second bias signal; and wherein for a first power supply signal having a magnitude that is greater than the magnitude of the second power supply signal and below a second threshold level, the second bias signal has a magnitude that increases in response to increases in the magnitude of the first power supply signal.

35. The buffer of claim 34, wherein for a first power supply signal having a magnitude that exceeds the second threshold level, the second bias signal remains constant in response to increases in the magnitude of the first power supply signal.

36. The buffer of claim 35, wherein the second threshold is about equal to a sum of a magnitude of the second power supply signal and a threshold voltage of the uppermost NMOS transistor in the second totem pole arrangement.

* * * * *